(12) United States Patent
David et al.

(10) Patent No.: US 11,764,410 B2
(45) Date of Patent: Sep. 19, 2023

(54) INTERNAL HEATING OF A BATTERY

(71) Applicant: Ningbo Geely Automobile Research & Development Co., Ltd., Ningbo (CN)

(72) Inventors: Sandeep David, Gothenburg (SE); Bengt Axelsson, Västra Frölunda (SE); Sri Vishnu Gorantla Narayana Murthy, Gothenburg (SE)

(73) Assignee: NINGBO GEELY AUTOMOBILE RESEARCH & DEVELOPMENT CO., Ningbo (CN)

(*) Notice: Subject to any disclaimer, the term of this patent is extended or adjusted under 35 U.S.C. 154(b) by 548 days.

(21) Appl. No.: 16/880,790

(22) Filed: May 21, 2020

(65) Prior Publication Data

US 2020/0282863 A1  Sep. 10, 2020

Related U.S. Application Data

(63) Continuation of application No. PCT/CN2018/109905, filed on Oct. 11, 2018.

(30) Foreign Application Priority Data

Nov. 28, 2017 (EP) .................................. 17204064

(51) Int. Cl.
*H01M 10/42* (2006.01)
*H01M 10/615* (2014.01)
(Continued)

(52) U.S. Cl.
CPC ............. *H01M 10/425* (2013.01); *B60L 1/02* (2013.01); *B60L 58/12* (2019.02); *B60L 58/27* (2019.02);
(Continued)

(58) Field of Classification Search
CPC ............. H01M 10/425; H01M 10/615; H01M 10/625; H01M 10/443; H01M 10/482;
(Continued)

(56) References Cited

U.S. PATENT DOCUMENTS

2010/0133025 A1   6/2010  Flett
2011/0298427 A1*  12/2011 Uemura ................ H01M 10/66
                                              320/134
(Continued)

FOREIGN PATENT DOCUMENTS

CN    202333081 U   7/2012
CN    105226307 A   1/2016
(Continued)

OTHER PUBLICATIONS

International Search Report and Written Opinion from corresponding International Application No. PCT/CN2018/109905, dated Jan. 4, 2019, 9 pages.
Extended European Search Report from corresponding European Application No. 17204064.4, dated May 5, 2018, 10 pages.

*Primary Examiner* — Brian R Ohara
*Assistant Examiner* — Aaron J Salter
(74) *Attorney, Agent, or Firm* — TUCKER ELLIS LLP

(57) ABSTRACT

A battery heating method and a battery heating system for a vehicle battery. The battery heating system includes a vehicle battery, an auxiliary energy storage device, a direct current to direct current converter and a processing circuitry. The processing circuitry is configured to cause the battery heating system to operate in a first mode wherein the direct current to direct current converter is configured to control a current to flow through the vehicle battery in a first direction and operate in a second mode wherein the direct current to direct current converter is configured to control a current to flow through the vehicle battery in a second direction.

7 Claims, 4 Drawing Sheets

(51) Int. Cl.
*H01M 10/625* (2014.01)
*G01R 31/374* (2019.01)
*B60L 58/27* (2019.01)
*B60L 58/12* (2019.01)
*B60L 1/02* (2006.01)
*H01M 10/44* (2006.01)
*H01M 10/48* (2006.01)
*H02J 7/00* (2006.01)

(52) U.S. Cl.
CPC ........ *G01R 31/374* (2019.01); *H01M 10/443* (2013.01); *H01M 10/482* (2013.01); *H01M 10/486* (2013.01); *H01M 10/615* (2015.04); *H01M 10/625* (2015.04); *B60L 2240/545* (2013.01); *H01M 2220/20* (2013.01); *H02J 7/007194* (2020.01); *H02J 2207/20* (2020.01); *H02J 2310/48* (2020.01)

(58) Field of Classification Search
CPC ............ H01M 10/486; H01M 2220/20; G01R 31/374; B60L 58/27; B60L 58/12; B60L 1/02; B60L 2240/545; H02J 2207/20; H02J 7/007194; H02J 2310/48
See application file for complete search history.

(56) References Cited

U.S. PATENT DOCUMENTS

| | | |
|---|---|---|
| 2012/0176082 A1 | 7/2012 | Lee et al. |
| 2014/0285135 A1 | 9/2014 | Ji et al. |
| 2014/0286071 A1 | 9/2014 | Choi |
| 2016/0036100 A1 | 2/2016 | Wang |
| 2016/0318418 A1 | 11/2016 | Tokushige |

FOREIGN PATENT DOCUMENTS

| | | |
|---|---|---|
| CN | 107221729 A | 9/2017 |
| DE | 102010024185 A1 | 1/2011 |

\* cited by examiner

INTERNAL HEATING OF A BATTERY

RELATED APPLICATION DATA

This application is a continuation of International Application No. PCT/CN2018/109905, filed Oct. 11, 2018, which claims the benefit of 17204064.4, filed Nov. 28, 2017, the disclosures of which are incorporated herein by reference in their entireties.

TECHNICAL FIELD

The disclosure pertains to the field of batteries and heating of cold batteries.

BACKGROUND

Today it is very popular to use batteries for powering all kinds of electrical devices. Not only smaller home electronic devices such as smartphones, tablets and portable computers but also electrical devices such as electrical drilling machines, electrical lawn mowers, electrical bikes and electrical vehicles make use of batteries. There are different types of batteries, and in particular batteries that are rechargeable are commonly used.

The performance of a battery is affected by the temperature. Most batteries have an optimum operation temperature. A common optimum operation temperature is around 20 degrees Celsius, or 68 degrees Fahrenheit. Batteries that are used indoor does usually not suffer from different surrounding temperatures. Indoor temperature is usually around the optimum operation temperature. Batteries that are used in devices that are outdoors are however heated up or cooled down due to the weather that affects the surrounding temperature.

The performance of a battery drops at low temperatures. This means that batteries used in cold environments such as in a vehicle when the weather is cold gets affected by the lower temperature. Vehicles that are pure electric or semi electric, such as hybrid or plug-in hybrid vehicles, are dependent on the performance of the vehicle battery. With a cold vehicle battery it can be impossible to obtain nominal power from the vehicle battery that is impacting the driving experience and the driving performance.

SUMMARY

Today one way to avoid a drop in battery performance, during low temperatures in the battery, is to heat up the battery. Heating up the battery will increase the performance of the battery and in particular it will increase the power that the battery can provide. Vehicles that are pure electric or semi electric, such as hybrid or plug-in hybrid vehicles, and that are dependent on the performance of the vehicle battery, the heating up of a cold battery is of particular importance. The performance of a vehicle battery, that is often a high voltage battery, has a major impact on the driving experience and driving performance.

An object of the present disclosure is to provide a system and method which seek to mitigate, alleviate, or eliminate one or more of the above-identified deficiencies in the art and disadvantages singly or in any combination.

The disclosure proposes battery heating system for a vehicle battery. The battery heating system comprise a vehicle battery, an auxiliary energy storage device, a direct current to direct current, DC-DC, converter and a processing circuitry. The auxiliary energy storage device is connected to the vehicle battery via the direct current to direct current, DC-DC, converter and the processing circuitry is connected to the direct current to direct current, DC-DC, converter. The processing circuitry is configured to cause the battery heating system to operate in a first mode wherein the direct current to direct current, DC-DC, converter is configured to control a current to flow through the vehicle battery in a first direction and operate in a second mode wherein the direct current to direct current, DC-DC, converter is configured to control a current to flow through the vehicle battery in a second direction. According to an aspect the direct current to direct current, DC-DC, converter controls the direction of the current by changing the output voltage magnitude. An advantage with the system is that no extra component for heating the vehicle battery is needed and since the current is flowing in and out of the vehicle battery, the State of Charge, SoC, level is maintained at a fairly constant value and thereby having a lower impact on the drivable electric range, the driving experience and the driving performance.

According to an aspect the processing circuitry is further configured to cause the battery heating system to change operation between the first operation mode and the second operation mode at a certain frequency. In this way the frequency can be optimized in order to get optimized heating of the battery and at the same time maintain the State of Charge, SoC, level at a fairly constant value.

According to an aspect the direct current to direct current, DC-DC, converter is configured to control the current by setting an output voltage of the direct current to direct current, DC-DC, converter that is higher or lower compared to the vehicle battery output voltage. In other words the direction of the current is controlled by the direct current to direct current, DC-DC, converter and dependent on the vehicle battery output voltage. According to an aspect the direct current to direct current, DC-DC, converter controls the direction of the current by changing the output voltage magnitude.

According to an aspect the vehicle battery has an internal resistance and the vehicle battery is heated up due to losses in the internal resistance when the current flows through the vehicle battery. This means that the internal resistance cause the heating of the vehicle battery and no additional components are needed for the heating of the vehicle battery.

According to an aspect the vehicle battery has an internal resistance that is dependent on the frequency at which operation between the first operation mode and the second operation mode is changed. An advantage with this that the frequency can be chosen to obtain an optimal internal resistance for heating the battery.

According to an aspect the frequency is adjustable to obtain the highest possible internal resistance in a shortest possible time for better heating performance of the battery heating system. In other words the frequency can be chosen to obtain a maximum resistance as fast as possible and thereby obtaining maximum power losses that are generated when the internal resistance is as high as possible. The power losses generates heat that heats up the vehicle battery.

According to an aspect the direct current to direct current, DC-DC, converter is a bi-directional buck-boost direct current to direct current, DC-DC, converter. According to an aspect the first mode is a boost mode wherein the bi-directional buck-boost direct current to direct current, DC-DC, converter is configured to control a current to flow through the vehicle battery in a first direction and the second mode is a buck mode, wherein the bi-directional buck-boost direct current to direct current, DC-DC, converter is configured to control a current to flow through the vehicle battery in a second direction. In other words this means that in the boost mode the output voltage of the bi-directional buck-boost direct current to direct current, DC-DC, converter is greater than the output voltage of the vehicle battery and in the buck mode the output voltage of the bi-directional buck-boost direct current to direct current, DC-DC, converter is lower than the output voltage of the vehicle battery.

According to an aspect the battery heating system further comprise a temperature measuring device connected to the vehicle battery for determining an internal temperature of the vehicle battery. According to an aspect the temperature measuring device is a temperature sensor located in the proximity or onto a battery cell. An advantage with a temperature measuring device the battery heating system can measure temperature changes in the vehicle battery.

According to an aspect the processing circuitry is configured to cause the battery heating system to change operation between the first operation mode and the second operation mode at a frequency dependent on the internal temperature of the vehicle battery. According to an aspect the frequency is further dependent on the age of the battery and/or the State of Charge, SoC, of the battery. This means that the heating of the battery can be controlled for optimized heating and performance of the battery.

The disclosure further proposes a battery heating method in a battery heating system for heating a vehicle battery. The battery heating method comprise the steps of operating the battery heating system in a first mode in which a direct current to direct current, DC-DC, converter controls a current to flow through the vehicle battery in a first direction and operating the battery heating system in a second mode in which the direct current to direct current, DC-DC, converter controls a current to flow through the vehicle battery in a second direction. An advantage with the system is that no extra component for heating the battery is needed and since the current is flowing in and out of the vehicle, the State of Charge, SoC, level is maintained at a fairly constant value and thereby having a lower impact on the drivable electric range, the driving experience and the driving performance.

According to an aspect the method further comprising changing operation between the first operation mode and the second operation mode at a frequency. An advantage with this is that the frequency can be chosen to obtain an optimal internal resistance for heating the battery.

According to an aspect the vehicle battery has an internal resistance and the vehicle battery is heated up due to losses in the internal resistance when the current flows through the vehicle battery. This means that the internal resistance cause the heating of the vehicle battery and no additional components are needed for the heating of the vehicle battery.

According to an aspect the vehicle battery has an internal resistance that is dependent on the frequency. An advantage with this that the frequency can be chosen to obtain an optimal internal resistance for heating the vehicle battery.

According to an aspect the frequency is adjustable to obtain the highest possible internal resistance in a shortest possible time for better heating performance of the battery heating system. In other words the frequency can be chosen to obtain a maximum internal resistance as fast as possible and thereby obtaining maximum power losses that are generated when the internal resistance is as high as possible. The power losses generates heat that heats up the vehicle battery.

BRIEF DESCRIPTION OF THE DRAWINGS

The foregoing will be apparent from the following more particular description of the example aspects, as illustrated in the accompanying drawings in which like reference characters refer to the same parts throughout the different views. The drawings are not necessarily to scale, emphasis instead being placed upon illustrating the example embodiments.

DETAILED DESCRIPTION

Figure 1:
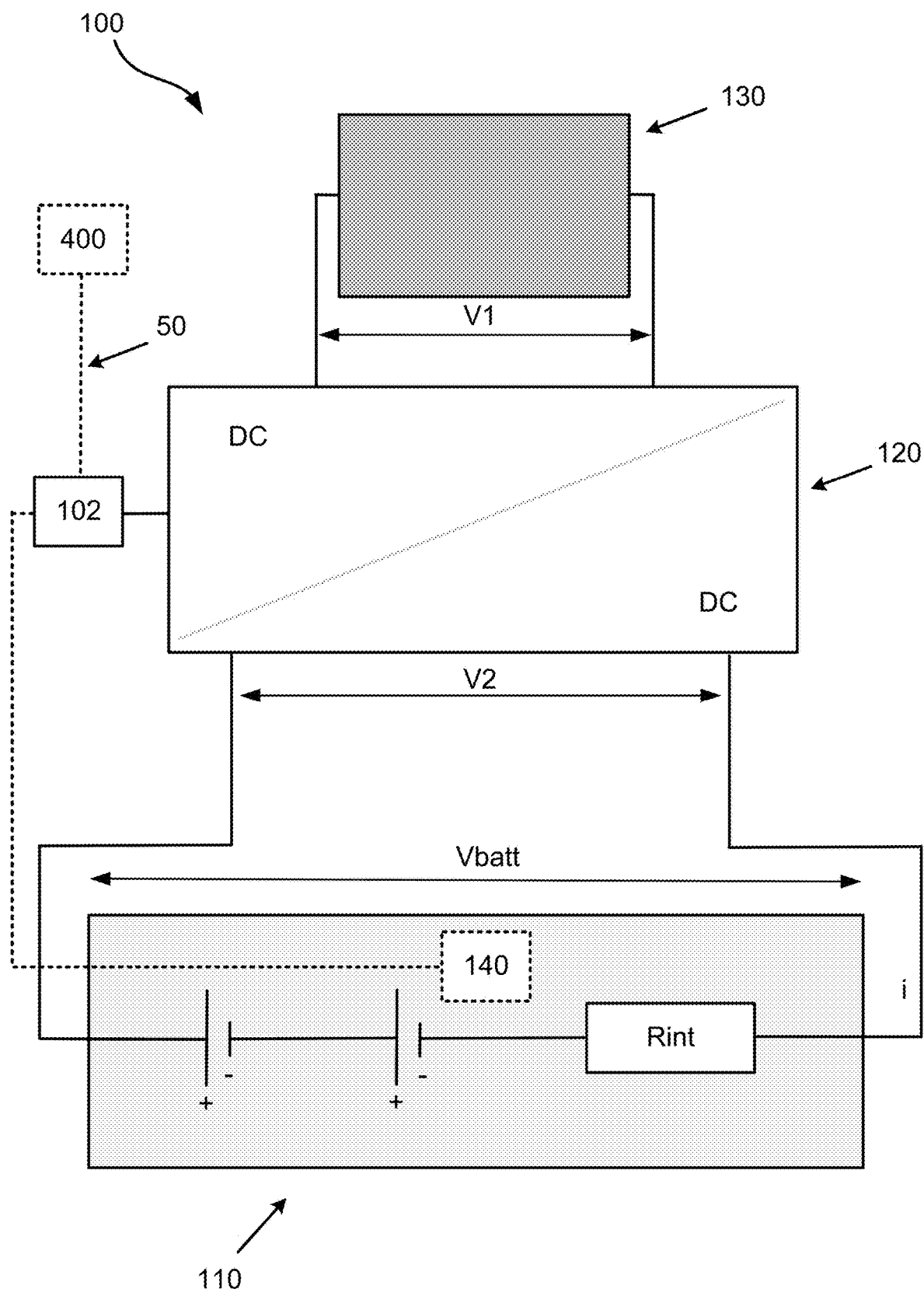
FIG. 1 illustrates a battery heating system for implementing the proposed method according to some aspects of the disclosure.

Aspects of the present disclosure will be described more fully hereinafter with reference to the accompanying drawings. The method and device disclosed herein can, however, be realized in many different forms and should not be construed as being limited to the aspects set forth herein. Like numbers in the drawings refer to like elements throughout.

The terminology used herein is for the purpose of describing particular aspects of the disclosure only, and is not intended to limit the disclosure. As used herein, the singular forms "a", "an" and "the" are intended to include the plural forms as well, unless the context clearly indicates otherwise.

In some implementations and according to some aspects of the disclosure, the functions or steps noted in the blocks can occur out of the order noted in the operational illustrations. For example, two blocks shown in succession can in fact be executed substantially concurrently or the blocks can sometimes be executed in the reverse order, depending upon the functionality/acts involved.

In the drawings and specification, there have been disclosed exemplary aspects of the disclosure. However, many variations and modifications can be made to these aspects without substantially departing from the principles of the present disclosure. Thus, the disclosure should be regarded as illustrative rather than restrictive, and not as being limited to the particular aspects discussed above. Accordingly, although specific terms are employed, they are used in a generic and descriptive sense only and not for purposes of limitation.

It should be noted that the word "comprising" does not necessarily exclude the presence of other elements or steps than those listed. It should further be noted that any reference signs do not limit the scope of the claims, that the example embodiments may be implemented at least in part by means of both hardware and software, and that several "means", "units" or "devices" may be represented by the same item of hardware.

The performance of a battery is affected by the temperature. Most batteries have an optimum operation temperature that are around the normal indoor room temperature, 20 degrees Celsius, or 68 degrees Fahrenheit. Vehicles that are pure electric or semi electric, such as hybrid or plug-in hybrid vehicles, are dependent on the performance of the vehicle battery. Since vehicles are operated outdoors the operation temperature will dependent with the weather. With a cold vehicle battery it can be impossible to obtain nominal power from the vehicle battery that is impacting the driving experience and the driving performance.

Today one way to avoid a drop in battery performance during low temperature in the battery is to heat up the battery. Heating up the battery will increase the performance of the battery and in particular it will increase the power that the battery can provide. Vehicles that are pure electric or semi electric, such as hybrid or plug-in hybrid vehicles, and that are dependent on the performance of the vehicle battery, the heating up of a cold battery is of particular importance. The performance of the vehicle battery, that is often a high voltage battery, has a major impact on the driving experience and the driving performance.

The inventors have identified that there is a need for a solution where a vehicle battery is heated up when exposed to low temperatures without affecting the State of Charge, SoC, of the vehicle battery, in an efficient way to enable great driving experience and driving performance even in lower temperatures.

The disclosure proposes a battery heating system 100 for a vehicle battery as illustrated in FIG. 1. The battery heating system comprise a vehicle battery 110, an auxiliary energy storage device 130, a direct current to direct current, DC-DC, converter 120 and a processing circuitry 102. A vehicle battery 110 used in pure electric or semi electric vehicle, such as a hybrid or a plug-in hybrid vehicle, is often a high voltage battery, also known as a "high voltage battery pack" or "HV battery pack". Such vehicle battery 110 usually have an output voltage around 300-400 volts and is used for propulsion and operation of the pure electric or semi electric vehicle. The vehicle battery 110 may however be any kind of battery.

The auxiliary energy storage device 130 can for example be a normal 12 or 24 Volt vehicle battery. The auxiliary energy storage device 130 can also be a capacitor in the inverter or a so called super capacitor that can store energy. In one example the auxiliary energy storage device 130 is an additional vehicle battery 110, meaning that the battery heating system 100 then comprise two vehicle batteries 110. The auxiliary energy storage device 130 can be used for other purposes and not only for the battery heating system 100.

The direct current to direct current, DC-DC, converter 120, also known as a "DC-DC converter" is an electronic circuit that converts a source of direct current, DC, from one voltage level, an input voltage level, and outputs a direct current, DC, at another voltage level, an output voltage level. In one example the input voltage level can be higher or lower than the output level. Direct current to direct current, DC-DC, converters are typically used for charging different types of batteries using different output voltage levels. The output voltage can be preset by the manufacturer of the direct current to direct current, DC-DC, converter or be set by a user of the direct current to direct current, DC-DC, converter. There are also direct current to direct current, DC-DC, converters that are fully programmable that can change the output voltage according to instructions from e.g. a software program carried out by a processing circuitry.

The processing circuitry 102 can be a Central Processing Unit, CPU, or any processing unit carrying out instructions of a software program or operating system.

The auxiliary energy storage device 130 is connected to the vehicle battery 110 via the direct current to direct current, DC-DC, converter 120 and the processing circuitry 102 is connected to the direct current to direct current, DC-DC, converter 120 as illustrated in FIG. 1. The auxiliary energy storage device 130 has an output voltage level V1 as illustrated in FIG. 1. The direct current to direct current, DC-DC, converter 120 has an output voltage level V2 as illustrated in FIG. 1.

The processing circuitry 102 is configured to cause the battery heating system 100 to operate in a first mode wherein the direct current to direct current, DC-DC, converter 120 is configured to control a current i to flow through the vehicle battery 110 in a first direction and operate in a second mode wherein the direct current to direct current, DC-DC, converter 120 is configured to control a current i to flow through the vehicle battery 110 in a second direction.

A battery that is rechargeable, such as a vehicle battery 110, has a certain so called State of Charge, SoC. The units of State of Charge, SoC, are percentage points where 100% means fully charged battery and 0% means a fully discharged battery, i.e. a battery that is "empty". A battery is traditionally charged to a certain State of Charge, SoC. Then, when the battery is connected to an electronic device that consumes power form the battery, current i is flowing in one direction and the battery is being discharged. After a certain time of usage, the battery is discharged to a lower State of Charge, SoC, and needs to be charged to a higher State of Charge, SoC, again. When the battery is charged the current i is flowing in the opposite direction compare to when the battery is discharged.

An advantage with the battery heating system 100 is not only that no extra component for heating the vehicle battery 110 is needed. Another advantage is also that since the current i is flowing in and out of the vehicle battery 110, i.e. in both directions, the State of Charge, SoC, level is maintained at a fairly constant value and thereby having a lower impact on the drivable electric range, the driving experience and the driving performance.

A further advantage with that no external component for heating up the vehicle battery 110 is used is that the external heat transfer losses are minimal as the cells in the vehicle battery 110 heats up due to its own internal resistance, Rint. In other words there is no need for transfer of heat to the vehicle battery 110 from a battery heater that is in the vicinity of the vehicle battery 110.

According to an aspect the processing circuitry 102 is further configured to cause the battery heating system 100 to change operation between the first operation mode and the second operation mode at a frequency, f. In this way the frequency f can be optimized in order to get optimized heating of the battery and at the same time maintain the State of Charge, SoC, level at a fairly constant value.

According to an aspect the operation of the battery heating system 100 by the processing circuitry 102 is automatic. The operation of the battery heating system 100 can be carried out by instructions of a software program or an application. According to an aspect the battery heating system 100 is controlled via a user interface 400. According to an aspect the user interface 400 is e.g. a touch sensitive display installed in the vehicle and connected to processing circuitry 102. According to an aspect the user interface 400 is on a remote device such as a smartphone or tablet that is running a software that controls the battery heating system 100. According to an aspect the remote device is connected to the processing circuitry 102 via a communication network 50. In one example the communication network 50 is a standardized wireless local area network such as a Wireless Local Area Network, WLAN, Bluetooth™, ZigBee, Ultra-Wideband, Near Field Communication, NFC, Radio Frequency Identification, RFID, or similar network. In one example the communication network 50 is a standardized wireless wide area network such as a Global System for Mobile Communications, GSM, Extended GSM, General Packet Radio Service, GPRS, Enhanced Data Rates for GSM Evolution, EDGE, Wideband Code Division Multiple Access, WCDMA, Long Term Evolution, LTE, Narrowband-IoT, 5G, Worldwide Interoperability for Microwave Access, WiMAX or Ultra Mobile Broadband, UMB or similar network. The communication network 50 can also be a combination of both a local area network and a wide area network. The communication network 50 can also be a wired network. According to some aspects of the disclosure the communication network 50 is defined by common Internet Protocols.

According to an aspect the battery heating system 100 is controlled by predetermined information indicating usage of the vehicle. In this way the battery heating system 100 can heat up the vehicle battery 110 in advance before the vehicle is intended to be used e.g. by setting a departure time. In one example a user can set a departure time via the user interface 400 of e.g. a smartphone that is remotely connected to the battery heating system 100 of the vehicle.

According to an aspect the direct current to direct current, DC-DC, converter 120 controls the current i by setting an output voltage, V2, of the direct current to direct current, DC-DC, converter 120 that is higher or lower compared to the vehicle battery 110 output voltage, Vbatt. In other words the direction of the current i is controlled by the direct current to direct current, DC-DC, converter 120 and dependent on the vehicle battery output voltage Vbatt.

According to an aspect the vehicle battery 110 has an internal resistance Rint and the vehicle battery 110 is heated up due to losses in the internal resistance Rint when the current i flows through the vehicle battery 110. This means that the internal resistance Rint cause the heating of the vehicle battery 110 and no additional components are needed for the heating of the vehicle battery 110. According to an aspect the vehicle battery has an internal resistance Rint that is dependent on the frequency, f, at which operation between the first operation mode and the second operation mode is changed. An advantage with this that the frequency f can be chosen to obtain an optimal internal resistance Rint for heating the vehicle battery 110. According to an aspect the frequency f is adjustable to obtain the highest possible internal resistance Rint in a shortest possible time for better heating performance of the battery heating system 100. In other words the frequency f can be chosen to obtain a maximum internal resistance Rint as fast as possible and thereby obtaining maximum power losses that are generated when the internal resistance Rint is as high as possible. The power losses generates heat that heats up the vehicle battery 110.

According to an aspect the direct current to direct current, DC-DC, converter 120 is a bi-directional buck-boost direct current to direct current, DC-DC, converter. According to an aspect the first mode is a boost mode wherein the bi-directional buck-boost direct current to direct current, DC-DC, converter 120 is configured to control a current i to flow through the vehicle battery 110 in a first direction and the second mode is a buck mode, wherein the bi-directional buck-boost direct current to direct current, DC-DC, converter 120 is configured to control a current i to flow through the vehicle battery 110 in a second direction. In other words this means that in the boost mode the output voltage V2 of the bi-directional buck-boost direct current to direct current, DC-DC, converter is greater than the output voltage of the vehicle battery, Vbatt, and in the buck mode the output voltage V2 of the bi-directional buck-boost direct current to direct current, DC-DC, converter 120 is lower than the output voltage of the vehicle battery, Vbatt.

Figure 2:
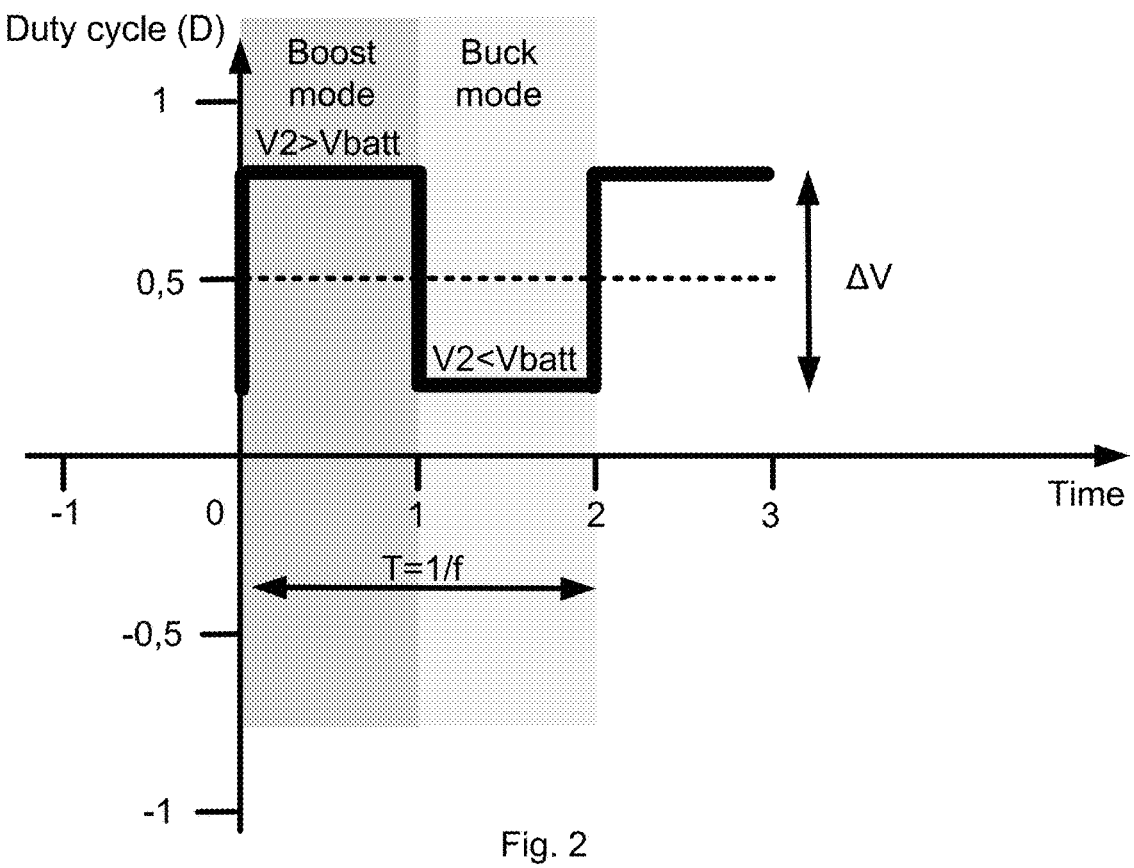
FIG. 2 and FIG. 3 illustrates exemplary graphs when the battery heating system is changing operation between first and second mode.
Figure 3:
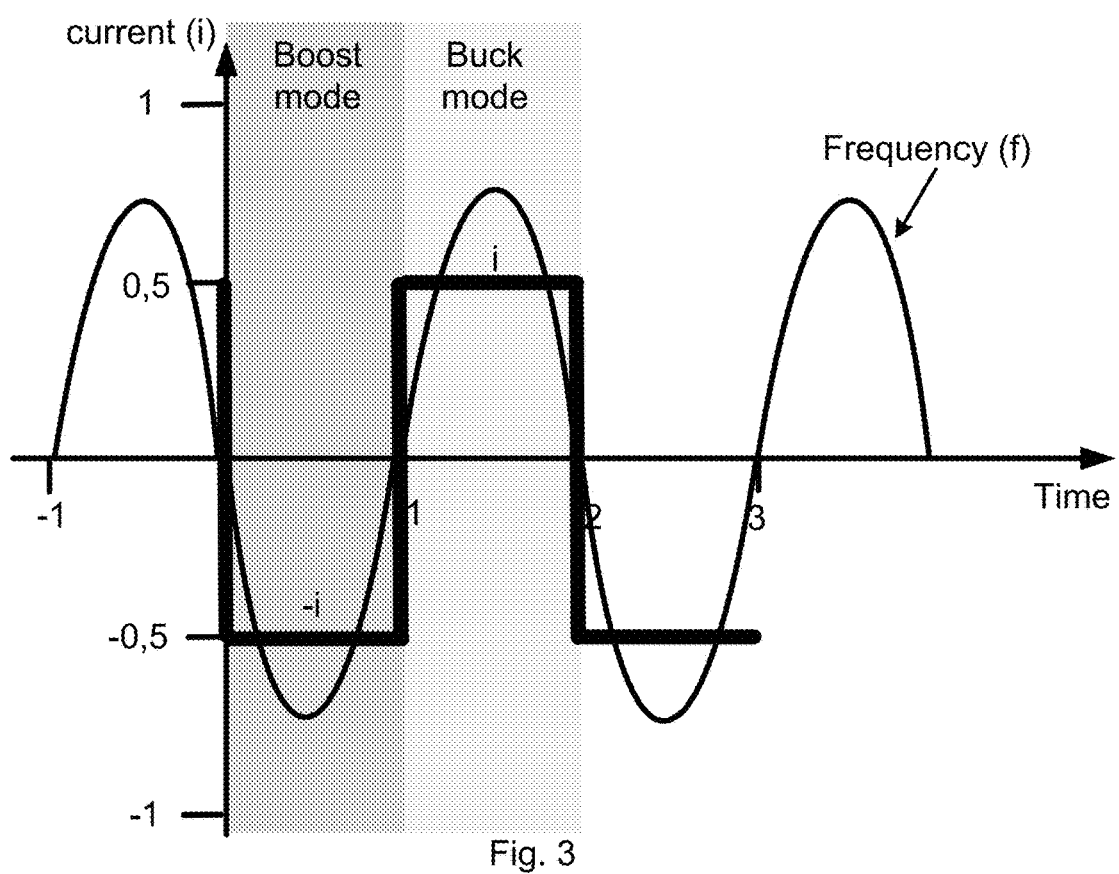

FIG. 2 and FIG. 3 illustrates exemplary graphs when the battery heating system 100 is changing operation between first and second mode.

In particular the frequency f at which the direct current to direct current, DC-DC, converter 120 is changing operation mode between from boost mode to buck mode in a cyclic manner is illustrated in FIG. 3.

The difference, ΔV, in the voltage levels between the boost mode, V2>Vbatt, and the buck mode, V2<Vbatt, leads to a cyclic current i flowing in and out of the vehicle battery 110 as shown in FIG. 3. The current i flowing in and out of the vehicle battery 110 makes that the State of Charge, SoC, level of the vehicle battery 110 maintains at a fairly constant value. The voltage difference ΔV dictates the magnitude of the current i flowing in and out of the vehicle battery 110.

In one example the vehicle battery 110, such as a high voltage vehicle battery, has an output voltage, Vbatt, of 350 volts. In the boost mode V2 can be chosen to be e.g. 365 volts. In the buck mode V2 can be chosen to be e.g. 335 volts. This means that in the example the changing operation mode from boost mode to buck mode in a cyclic manner implies +/−15 volts, and hence with a difference, ΔV, that is 30 volts. The magnitude of the current i flowing in and out of the vehicle battery 110 should be chosen not to hurt the State of Health, SoH of the battery. The operation values of a battery is normally set by the manufacturer of the battery and can serve as input parameters for operation of the battery heating system 100.

In boost mode, as illustrated in FIG. 2, when the duty cycle D is such that V2>VBatt, the heating current i flows into the vehicle battery 110, illustrated in FIG. 3.

In buck mode, as illustrated in FIG. 2, when the duty cycle D is such that V2<VBatt, the heating current i flows out of the vehicle battery 110, illustrated in FIG. 3.

The square wave pattern of the current i, illustrated in FIG. 3, has a fundamental sinusoidal component whose frequency is same as the frequency f. The internal resistance Rint of the vehicle battery 110 depends on the frequency f of the current i flowing through it.

Thus, the frequency f of changing operation between first and second mode of the battery heating system 100 is chosen such that the internal resistance Rint of the vehicle battery 110 is optimal and this frequency f is usually in the order of few hertz, Hz.

Figure 4:
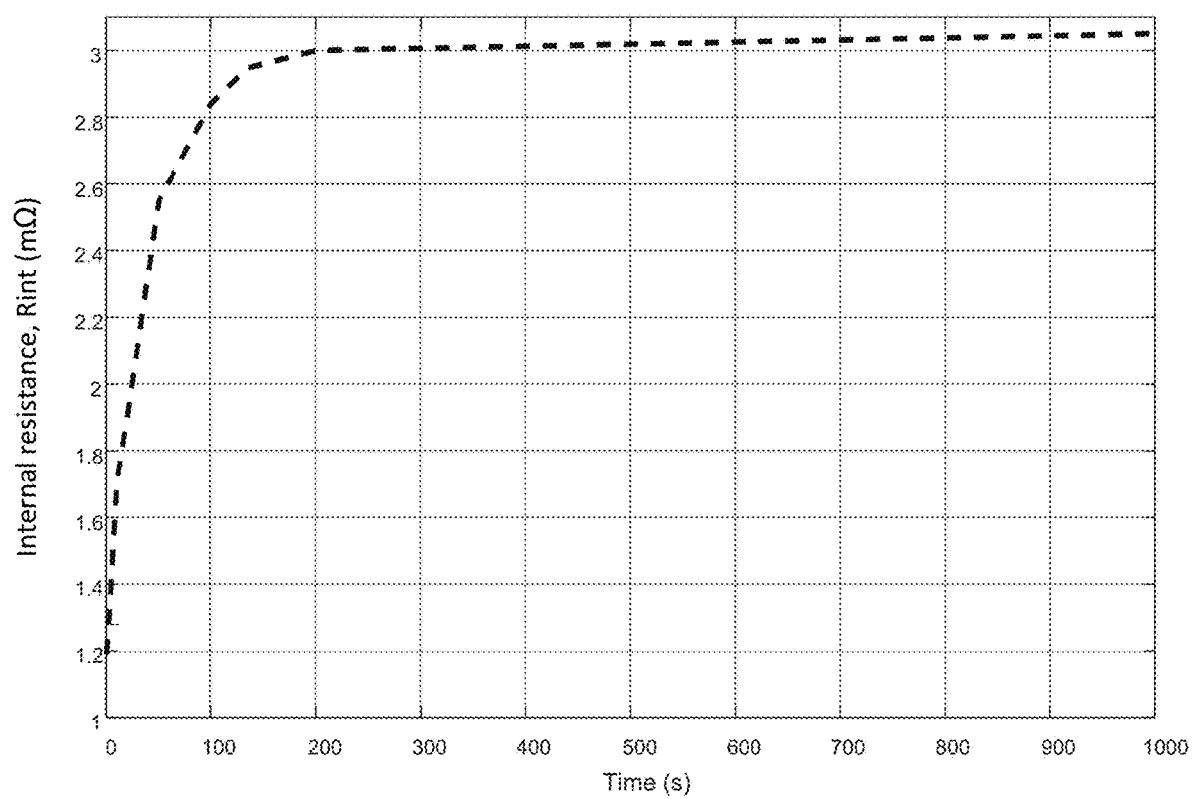
FIG. 4 illustrates an exemplary graph how the internal resistance increases as time increases.

FIG. 4 illustrates an exemplary graph how the internal resistance Rint, measured in mΩ, increases as time, measured in seconds, increases. Or put in other words, how the internal resistance Rint increases as frequency f decreases, since time=1/frequency. From the graph in FIG. 4 it becomes clear that after a certain time, the rate at which the internal resistance Rint increases reduces drastically because it saturates. Therefore the frequency f of changing operation between the first and the second mode of the battery heating system 100 can be chosen to obtain an optimized internal resistance Rint in order to obtain a greater heating effect in a shorter time span. In the example as illustrated in FIG. 4 after 200 ms the internal resistance is already close to 3 mΩ and will not increase much more. In the example the frequency f of changing operation between the first and the second mode of the battery heating system 100 can therefore be chosen to be, calculated as frequency=1/time, 1/200 ms=1/0.2=5 i.e. a frequency at 5 Hz can be chosen.

According to an aspect the battery heating system 100 further comprise a temperature measuring device 140 connected to the vehicle battery 110 for determining an internal temperature of the vehicle battery 110. According to an aspect the temperature measuring device is a temperature sensor located in the proximity or onto a battery cell. An advantage with a temperature measuring device the battery heating system can measure temperature changes in the vehicle battery 110. In one example the temperature is used as an input for controlling the operation of the battery heating system 100. According to an aspect a user is notified via a user interface 400 is on a remote device, such as a smartphone, that the temperature of the vehicle battery 110 is below a certain level and that pre-heating before departure is recommended.

According to an aspect the processing circuitry 102 is configured to cause the battery heating system 100 to change operation between the first operation mode and the second operation mode at a frequency f dependent on the internal temperature of the vehicle battery 110. According to an aspect the frequency is further dependent on the age of the battery and/or the State of Charge, SoC, of the battery. This means that the heating of the battery can be controlled for optimized heating and performance of the battery. The knowledge of the temperature is also useful for turning the battery heating system 100 on or off.

Figure 5:
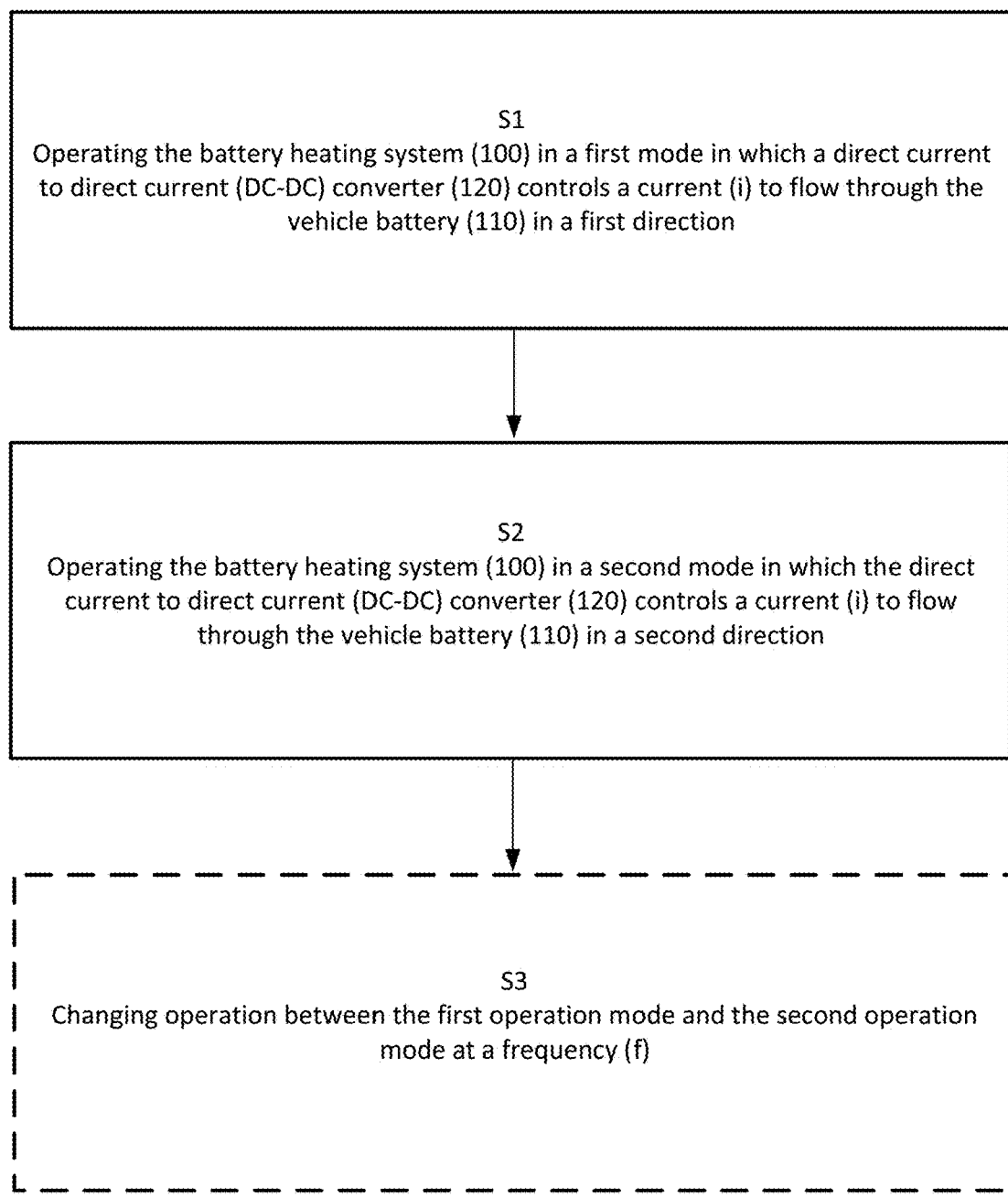
FIG. 5 illustrates a flow chart of the method steps according to some aspects of the disclosure.

The disclosure further proposes a battery heating method in a battery heating system 100 for heating a vehicle battery. According to an aspect the battery heating system 100 is configured to perform any of the aspects of the method. FIG. 5 illustrates a flow chart of the method steps according to some aspects of the disclosure.

The battery heating method comprise the steps of S1 operating the battery heating system 100 in a first mode in which a direct current to direct current, DC-DC, converter 120 controls a current i to flow through the vehicle battery 110 in a first direction and S2 operating the battery heating system 100 in a second mode in which the direct current to direct current, DC-DC, converter 120 controls a current i to flow through the vehicle battery 110 in a second direction. An advantage with the system is that no extra component for heating the battery is needed and since the current is flowing in and out of the vehicle, the State of Charge, SoC, level is maintained at a fairly constant value and thereby having a lower impact on the drivable electric range, driving experience and driving performance.

According to an aspect the method further comprising the step S3 changing operation between the first operation mode and the second operation mode at a frequency f. An advantage with this is that the frequency can be chosen to obtain an optimal internal resistance for heating the battery.

According to an aspect the vehicle battery 110 has an internal resistance Rint and the vehicle battery 110 is heated up due to losses in the internal resistance Rint when the current i flows through the vehicle battery 110. This means that the internal resistance cause the heating of the vehicle battery and no additional components are needed for the heating of the vehicle battery.

According to an aspect the vehicle battery 110 has an internal resistance Rint that is dependent on the frequency f. An advantage with this that the frequency can be chosen to obtain an optimal internal resistance for heating the battery.

According to an aspect the frequency f is adjustable to obtain the highest possible internal resistance Rint in a shortest possible time for better heating performance of the battery heating system 100. In other words the frequency can be chosen to obtain a maximum resistance as fast as possible and thereby obtaining maximum power losses that are generated when the internal resistance is as high as possible. The power losses generates heat that heats up the vehicle battery.

The disclosure further proposes a computer program comprising computer-readable code which, when executed by the processing circuitry 102 of the battery heating system 100, causes the battery heating system 100 to perform the method. Hence the code can be reproduced and run on plural different battery heating systems 100 to perform the method. According to an aspect, the method is carried out by instructions in a computer program that is downloaded and run by the processing circuitry 102 of the battery heating system 100. In one example the computer program is a so called app. The app is either free or can be bought by the user of the battery heating system 100. The same app can generate a user interface for user interaction via a user interface 400 of the battery heating system 100. The invention further proposes a computer program product comprising a non-transitory memory storing a computer program. Hence, the memory can maintain the code so that the method can be executed at any time.

In the drawings and specification, there have been disclosed exemplary aspects of the invention. However, many variations and modifications can be made to these aspects. All the different aspects of the invention can be used in any combination. Accordingly, although specific terms are employed, they are used in a generic and descriptive sense only and not for purposes of limitation, the scope of the invention being defined by the following claims.

The invention claimed is:

1. A battery heating system for a vehicle battery, the battery heating system comprises:
    a vehicle battery;
    an auxiliary energy storage device;
    a direct current to direct current converter; and
    a processing circuitry,
        wherein the auxiliary energy storage device is connected to the vehicle battery via the direct current to direct current converter and the processing circuitry is connected to and controls the direct current to direct current converter,
    the processing circuitry is configured to cause the battery heating system to perform a heating operation of the vehicle battery by:
        alternating, at a frequency, between in a first mode wherein the direct current to direct current converter is configured to control a current to flow through the vehicle battery in a first direction and a second mode wherein the direct current to direct current converter is configured to control the current to flow through the vehicle battery in a second direction;
    wherein the vehicle battery has an internal resistance that is dependent on the frequency at which operation between the first mode and the second mode is alternated;
    wherein the frequency is adjustable to obtain a highest possible internal resistance of the vehicle battery in a shortest possible time for better heating performance of the battery heating system; and
    wherein the adjustable frequency is an inverse of an amount of time it takes for the internal resistance of the vehicle battery to rise from a value of the internal resistance before the heating operation starts to a value approaching a maximum internal resistance.

2. The battery heating system according to claim 1, wherein the direct current to direct current converter is configured to control the current by setting an output voltage of the direct current to direct current converter that is higher or lower compared to the vehicle battery output voltage.

3. The battery heating system according to claim 1, wherein the vehicle battery is heated up due to losses in the internal resistance when the current flows through the vehicle battery.

4. The battery heating system according to claim 1, wherein the direct current to direct current converter is a bi-directional buck-boost direct current to direct current converter.

5. The battery heating system according to claim 4, wherein the first mode is a boost mode wherein the bi-directional buck-boost direct current to direct current converter is configured to control the current to flow through the vehicle battery in the first direction; and the second mode is a buck mode, wherein the bi-directional buck-boost direct current to direct current converter is configured to control the current to flow through the vehicle battery in the second direction.

6. The battery heating system according to claim 1, wherein the battery heating system further comprises a temperature measuring device connected to the vehicle battery for determining an internal temperature of the vehicle battery.

7. The battery heating system according to claim 6, wherein the processing circuitry is configured to perform the heating operation dependent on the internal temperature of the vehicle battery.

\* \* \* \* \*